(12) United States Patent
Dawson et al.

(10) Patent No.: US 8,937,840 B2
(45) Date of Patent: Jan. 20, 2015

(54) DIGITAL VOLTAGE BOOST CIRCUIT

(75) Inventors: James W. Dawson, Poughkeepsie, NY (US); Noam Jungmann, Tel-Aviv (IL); Elazar Kachir, Haifa (IL); Udi Nir, Tel-Aviv (IL); Donald W. Plass, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 243 days.

(21) Appl. No.: 13/326,727

(22) Filed: Dec. 15, 2011

(65) Prior Publication Data

US 2013/0155787 A1    Jun. 20, 2013

(51) Int. Cl.
*G11C 5/14* (2006.01)

(52) U.S. Cl.
USPC ....... 365/189.09; 365/204; 365/226; 323/312

(58) Field of Classification Search
USPC ........... 365/189.09 O, 204 X, 226 X, 189.09, 365/204, 226; 323/312 X, 312
See application file for complete search history.

(56) References Cited

U.S. PATENT DOCUMENTS

| | | | |
|---|---|---|---|
| 5,438,290 A | 8/1995 | Tanaka | |
| 5,847,946 A | 12/1998 | Wong | |
| 5,994,928 A | 11/1999 | Chevallier | |
| 7,345,916 B2 * | 3/2008 | Yang et al. | 365/185.14 |
| 7,403,439 B2 | 7/2008 | Miller et al. | |
| 7,920,397 B1 * | 4/2011 | Nataraj et al. | 365/49.1 |
| 8,705,300 B1 * | 4/2014 | Xu et al. | 365/201 |
| 2006/0044882 A1 | 3/2006 | Nahas | |
| 2008/0205120 A1 * | 8/2008 | Sung | 365/149 |

FOREIGN PATENT DOCUMENTS

| | | |
|---|---|---|
| CN | 1383265 A | 12/2002 |
| CN | 201315550 Y | 9/2009 |
| EP | 1976124 A1 | 10/2008 |
| JP | 2005158128 A | 6/2005 |

OTHER PUBLICATIONS

"A Bit-Line Leakage Compensation Scheme for Low-Voltage SRAM's", IEEE 2000 Symposium on VLSI Circuits, Digest of Technical Papers, pp. 707.*
International Search Report and Written Opinion of the ISA dated Apr. 25, 2013—International Application No. PCT/IB2012/056918.

* cited by examiner

*Primary Examiner* — Vanthu Nguyen
(74) *Attorney, Agent, or Firm* — International IP Law Group, PLLC

(57) ABSTRACT

A digital voltage boost circuit, optionally working in parallel with an analog voltage regulator, periodically injects a constant amount of current each cycle into the bit line of a high density memory array to eliminate the bias voltage reduction which would otherwise occur. This results in a much faster recovery time and reduces the semiconductor real estate required. A pulse generator in the boost circuit generates one or more current modulation signals which control corresponding current supply devices in a current source. The boost circuit drives a constant amount of current to the bias voltage node each memory cycle.

23 Claims, 2 Drawing Sheets

DIGITAL VOLTAGE BOOST CIRCUIT

FIELD OF THE INVENTION

The present invention relates to the field of digital and analog circuit design, and more particularly relates to a digital boost circuit for maintaining a constant bias voltage level used in high frequency memory arrays.

SUMMARY OF THE INVENTION

There is thus provided in accordance with the invention, a voltage boost circuit for use with an analog voltage regulator, comprising a pulse generator operative to generate one or more current modulation signals, and a current source operative to inject current into the output of said analog voltage regulator in accordance with said one or more current modulation signals.

There is also provided in accordance with the invention, a circuit for generating a memory array bit line bias voltage, comprising an analog voltage regulator operative to generate said memory array bit line bias voltage in accordance with a voltage reference, a digital voltage boost circuit placed in parallel to said analog voltage regulator and operative to inject current each cycle to a memory array bit line bias voltage node to aid in regulation thereof, said digital voltage boost circuit comprising a pulse generator operative to generate one or more current modulation signals, and a current source operative to inject current into said memory array bit line bias voltage node in accordance with said one or more current modulation signals.

There is further provided in accordance with the invention, a method of generating a stable current source for use by a memory array, said method comprising providing an analog voltage regulator operative to generate a memory array bit line bias voltage in accordance with a voltage reference, and injecting current to a memory array bit line bias voltage node to aid in maintaining the bias voltage level.

There is also provided in accordance with the invention, a method of generating a stable bit line voltage for use by a memory array, said method comprising generating a constant amount of current each cycle, and injecting said current into said bit line voltage node so as to substantially eliminate any bias voltage reduction of said bit line.

BRIEF DESCRIPTION OF THE DRAWINGS

The invention is herein described, by way of example only, with reference to the accompanying drawings, wherein.

DETAILED DESCRIPTION OF THE INVENTION

Conventional static memory arrays utilize two power supplies: (1) $V_{CS}$ supplying the static memory cells themselves; and (2) $V_{DD}$ supplying the logic circuitry of the array. To allow denser arrays, a third supply $V_{BLH}$ is used for the bit line voltage. In a high density array, the capacitance of the bit line is increased. Therefore, a regulated bit line voltage in high end (i.e. high frequency) memory arrays is used. Regulated bit line voltage is used in high frequency memory arrays to improve performance and stability. An analog voltage regulator is used to handle the increased capacitance of the bit line.

A drawback of the analog voltage regulator is its slow recovery time. It is not able to handle the speed of the circuit whose frequency can in the order of 2 GHz or higher. This impacts both the array performance and stability as power on reset (POR) voltage cannot be guaranteed. The result is that the bit line voltage output of the analog regulator is not stable having high ripple content. This is an issue when trying to support high frequency applications. To handle the current load until the analog regulator catches up a large amount of decoupling capacitance may be added. This has an impact on both the semiconductor area and its performance, especially as semiconductor die size increases. One approach to reducing the ripple is to increase the capacitance. Increasing the capacitance, however, demands a large area in which to implement the capacitor which is undesirable. A deep trench (DT) capacitor can also be used to mitigate the required area but this is a costly process increasing the die cost and manufacturing complexity.

Another approach is to inject a constant amount of current each cycle using a digital circuit to eliminate the bias voltage reduction which would otherwise occur. This approach has a much faster recovery time and saves semiconductor real estate over the prior art solution of increasing the decoupling capacitor. This approach is especially useful to integrated circuits (ICs) that do not have high density capacitors.

Note that the digital voltage boost mechanism can be used in parallel with an analog voltage regulator with supporting decoupling capacitor or as a stand alone mechanism to drive the regulated voltage. Preferably, the mechanism is operative to maintain/restore the bias voltage every cycle.

Figure 1:
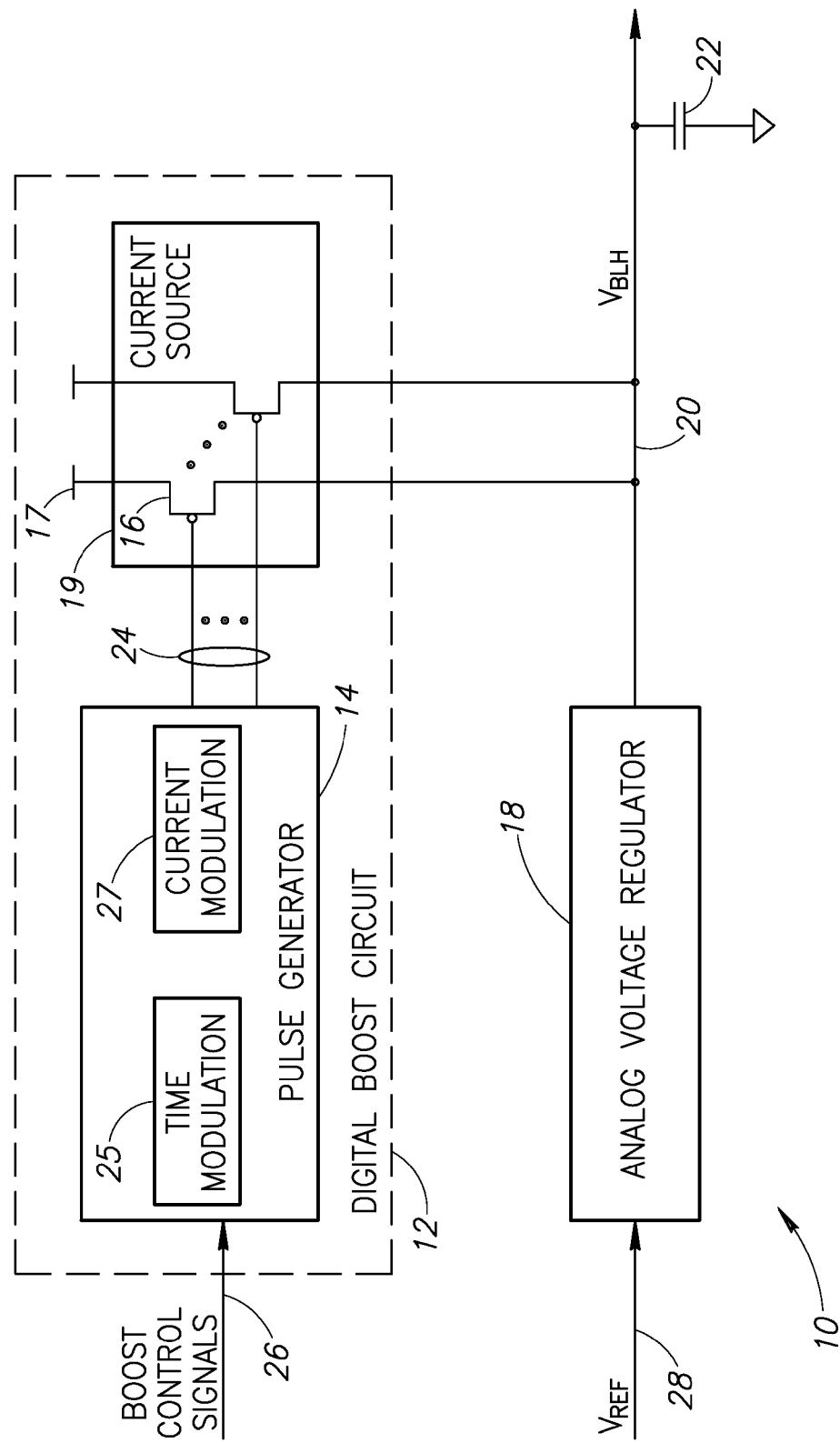
FIG. 1 is a high level block diagram illustrating an example boost circuit in accordance with the present invention.

A high level block diagram illustrating an example boost circuit in accordance with the present invention is shown in FIG. 1. The example boost circuit, generally referenced 10, comprises a digital boost circuit 12 coupled to the output of an analog voltage regulator 18, bit line voltage $V_{BLH}$ node 20. The digital boost circuit 12 comprises a pulse generator 14 and current source 19. The pulse generator receives one or more boost control signals and utilizes time modulation 25 and current modulation 27 blocks to generate one or more output current modulation signals 24. The one or more output current modulation signals 24 are input to corresponding current supply devices 16 in current source 19. For example current supply devices 16 may comprise field effect transistor (FET) devices.

The analog voltage regulator 18 is operative to generate a bit line bias voltage 20 across decoupling capacitance 22. The output voltage is generated in accordance with a reference voltage $V_{REF}$ 28.

In operation, the pulse generator in the boost circuit generates one or more current modulation signals 24 which control corresponding current supply devices in the current source 19. The boost circuit is operative to drive a constant amount of current to the bias voltage node 20 each memory cycle. One advantage of this voltage boost circuit is the improved response time and restoration of the bias voltage from the first and every cycle. Further, the ability of the analog voltage regulator to support high frequency applications is greatly improved.

The voltage boost mechanism of the invention can be used, for example, to supply circuits such as high density memory arrays with a stable and robust current source across process variations. Typically, the analog voltage regulator 18 alone is used for this purpose with a reference voltage $V_{REF}$ 28 to be able to compensate for current consumption by the load circuit. The voltage boost mechanism, operating in parallel or standalone, overcomes the inability of the analog regulator to react in high frequency to load current variations.

The voltage boost mechanism comprises a circuit operative to inject into the array bias voltage capacitor 22 a constant amount of current each memory cycle so as to maintain the bias voltage level $V_{BLH}$ 20. Note that the implementation of the voltage boost circuit (i.e. current injection circuit) is not limited to the circuits described in connection with FIG. 1 supra or FIG. 2 infra, as one skilled in the electrical arts can apply the mechanism of the present invention to other circuits depending on the application and implementation.

The boost circuit 12 is operative to modulate the current in several ways via the pulse generator 14. In a first way, the point in time where the current is injected into node 20 can be configured and modulated via time modulation block 25. Modulation in time can be achieved by the amount of time the boost circuit is active, i.e. using pulse width modulation (PWM) of the boost control signal. In a second way, the amount of current being injected into the node 20 can be configured and modulated by current modulation block 27. Modulation in current can be achieved by the number of current supply devices that actively source current into the node 20.

Each of modulation by time and modulation of current can be controlled independently of each other, i.e. time can be controlled independent of current and current can be controlled independent of time. The control of the digital boost voltage can be configured to (1) allow (i.e. compensate for) different read and write current demands and (2) provide better tracking of semiconductor process variations. It is appreciated that the pulse generator logic driving the current source may be modified by one skilled in the art to configure the point in time in which the voltage boost circuit is active (i.e. injecting current) in accordance with specific use and application of the mechanism.

Figure 2:
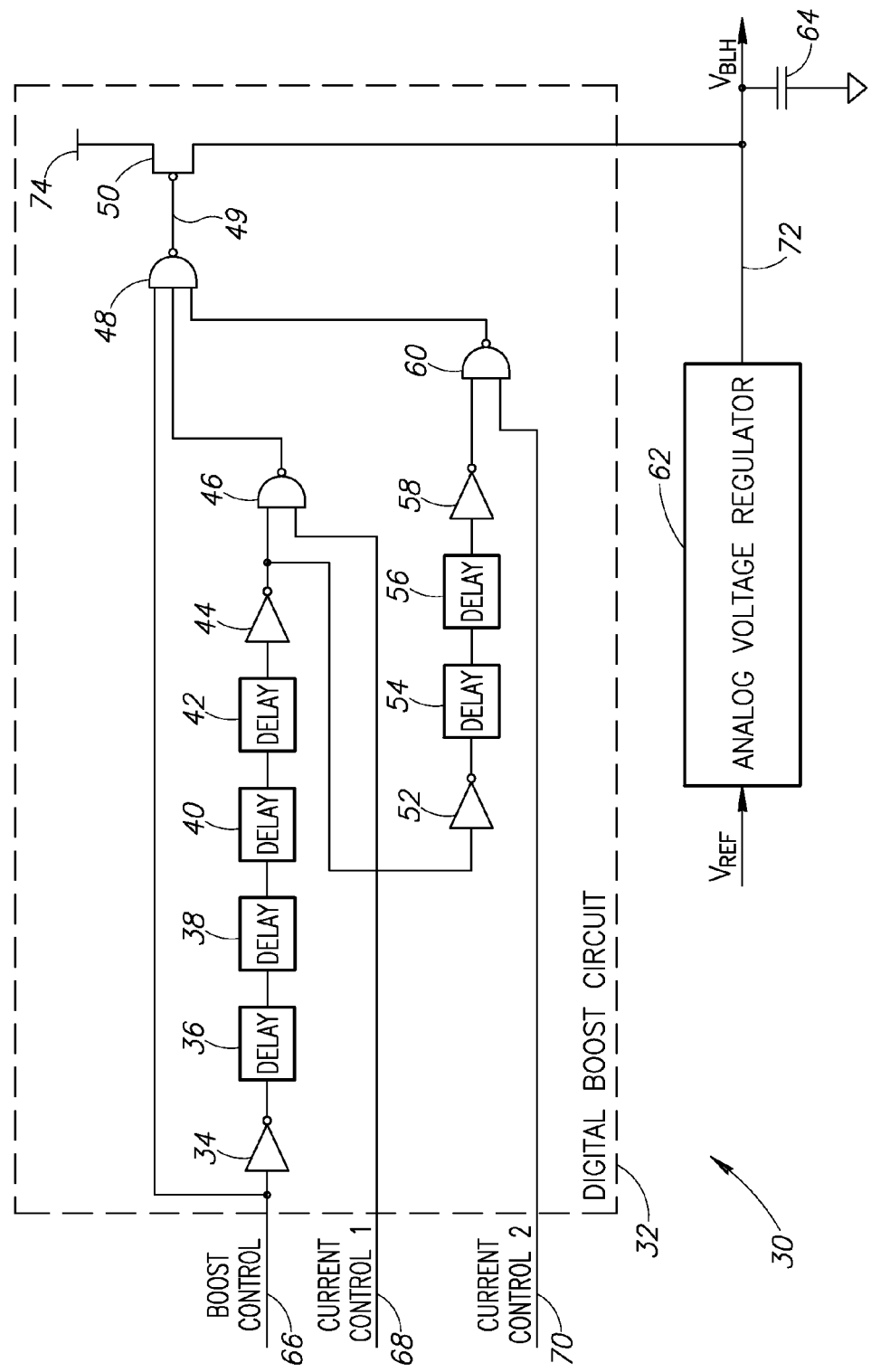
FIG. 2 is a more detailed circuit diagram illustrating an example boost circuit embodiment of the present invention.

A more detailed circuit diagram illustrating an example boost circuit embodiment of the present invention is shown in FIG. 2. The circuit, generally referenced 30, comprises a digital boost circuit 32, analog voltage regulator 62 and decoupling capacitor 64. The digital boost circuit 32 comprises a boost control signal 66 input to a logic chain comprising inverter 34, delay blocks 36, 38, 40, 42 and inverter 44; a current control 1 signal 68 input to one input of NAND gate 46 with the output of inverter 44 input to the second input; a current control 2 signal 70 input to one input of NAND gate 60 along with the output of the logic chain consisting of inverter 52, delay blocks 54, 56 and inverter 58, input to the second input; and three input NAND gate 48 whose output controls current source 50 comprising a FET coupled to $V_{BLH}$ node 72 and tied to $V_{DD}$ 74.

The operation of the boost circuit logic in accordance with the boost control and current control signals determines the pulse width modulation of the current modulation signal 49 output of the NAND gate 48. Preferably, the injection of current takes place at the stage in the memory cycle where it is desired to restore the bias voltage which was partially discharged earlier in the cycle. The boost circuit generates a pulse (i.e. current modulation signal 49) which drives one or more FET devices 50, opened for a relatively short time and operative to drive the required current. The amount of current is preferably determined by both the pulse width modulation (i.e. timing) and the number of current supply devices (e.g., FETs) that are active (i.e. turned on), both of which are configurable and controllable.

The voltage boost circuit thus functions as an assist circuit to the analog regulator that allows the desired bias voltage level to be reached quickly while maintaining a level of control of the assist provided. The final regulated voltage level is regulated by the analog regulator. Note that it is not critical how this voltage is driven onto the memory array bit line $V_{BLH}$. In the embodiment described herein, one or more FET devices are used for this purpose.

Note further that the voltage boost circuit provides voltage regulation rather than current regulation. The boost circuit quickly supplies current in order to maintain a regulated bias voltage used as static memory bit line voltage $V_{BLH}$ rather than handling undesirable current spikes result from circuit switching.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A digital voltage boost circuit, comprising:
   a digital pulse generator operative to generate one or more current modulation signals; and
   a current source operative to inject current into a memory array bit line to maintain a bias voltage level in accordance with said one or more current modulation signal without increasing capacitance of the digital boost circuit, wherein the injected current is to compensate for a lack of current provided to the memory array bit line during a recovery time of an analog voltage regulator coupled to the memory array bit line.

2. The circuit according to claim 1, wherein said one or more current modulation signals determine the timing for injecting current into the output of said analog voltage regulator.

3. The circuit according to claim 1, wherein said one or more current modulation signals determine an amount of current to be injected into the output of said analog voltage regulator.

4. The circuit according to claim 3, wherein the amount of current injected is modulated by the amount of time said one or more modulation signals are active.

5. The circuit according to claim 3, wherein the amount of current injected is modulated by the number of current suppliers in said current source coupled to the output of said analog voltage regulator.

6. The circuit according to claim 1, wherein said current source comprises one or more current suppliers.

7. The circuit according to claim 6, wherein each current supplier comprises a field effect transistor (FET) device.

8. A circuit for generating a memory array bit line bias voltage, comprising:
- an analog voltage regulator operative to generate said memory array bit line bias voltage in accordance with a voltage reference;
- a digital voltage boost circuit parallel to said analog voltage regulator and operative to inject current each cycle to a memory array bit line to maintain a bias voltage level without increasing capacitance of the digital boost circuit, wherein the injected current is to compensate for a lack of current provided to the memory array bit line during a recovery time of an analog voltage regulator coupled to the memory array bit line, said digital voltage boost circuit comprising:
  - a pulse generator operative to generate one or more current modulation signals; and
  - a current source operative to inject current into said memory array bit line in accordance with said one or more current modulation signals.

9. The circuit according to claim 8, wherein said one or more current modulation signals determine the desired timing for injecting current into the output of said analog voltage regulator.

10. The circuit according to claim 8, wherein said one or more current modulation signals determine a desired amount of current to be injected into the output of said analog voltage regulator.

11. The circuit according to claim 10, wherein the amount of current injected is modulated by the amount of time said one or more modulation signals are active.

12. The circuit according to claim 10, wherein the amount of current injected is modulated by the number of current suppliers in said current source coupled to the output of said analog voltage regulator.

13. The circuit according to claim 8, wherein said current source comprises one or more current suppliers.

14. The circuit according to claim 13, wherein each current supplier comprises a field effect transistor (FET) device.

15. The circuit according to claim 8, wherein the current injection is modulated to compensate for different current demands of memory array read and write operations.

16. A method of generating a stable current source for use by a memory array, said method comprising:
- providing an analog voltage regulator operative to generate a memory array bit line bias voltage in accordance with a voltage reference; and
- injecting current from a digital boost circuit to a memory array bit line to aid in maintaining the bias voltage level without increasing capacitance of the digital boost circuit, wherein the injected current is to compensate for a lack of current provided to the memory array bit line during a recovery time of the analog voltage regulator coupled to the memory array bit line.

17. The method according to claim 16, wherein said injected current is modulated with respect to the desired timing of said current injection.

18. The method according to claim 16, wherein said injected current is modulated with respect to the desired amount of current to be injected.

19. The method according to claim 16, wherein the current injection is modulated to compensate for different current demands of memory array read and write operations.

20. The method according to claim 16, wherein one or more field effect transistor (FET) devices are used to inject current to said memory array bit line bias voltage node.

21. A method of generating a stable bit line voltage for use by a memory array, said method comprising:
- generating a constant amount of current each cycle; and
- injecting said current from a digital boost circuit into said bit line so as to substantially eliminate any bias voltage reduction of said bit line without increasing capacitance of the digital boost circuit, wherein the injected current is to compensate for a lack of current provided to the memory array bit line during a recovery time of an analog voltage regulator coupled to the memory array bit line.

22. The method according to claim 21, further comprising providing an analog voltage regulator operative to generate and regulate said bit line voltage wherein said current injection into said bit line occurs in parallel therewith.

23. The digital voltage boost circuit of claim 1, wherein the current source comprises a field effect transistor (FET) directly coupled to the output of the analog voltage regulator such that the FET, when opened, connects a system supply current to the memory array bit line at a voltage level that does not exceed the system supply, and to compensate for a bias voltage reduction associated with the analog voltage regulator.

* * * * *